United States Patent
Takano et al.

(10) Patent No.: US 10,439,514 B2
(45) Date of Patent: Oct. 8, 2019

(54) POWER CONVERSION CIRCUIT

(71) Applicant: Panasonic Intellectual Property Management Co., Ltd., Osaka (JP)

(72) Inventors: Yoh Takano, Fukushima (JP); Shinichi Kohda, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/082,214

(22) PCT Filed: Feb. 28, 2017

(86) PCT No.: PCT/JP2017/007654
§ 371 (c)(1),
(2) Date: Sep. 4, 2018

(87) PCT Pub. No.: WO2017/159338
PCT Pub. Date: Sep. 21, 2017

(65) Prior Publication Data
US 2019/0260310 A1    Aug. 22, 2019

(30) Foreign Application Priority Data
Mar. 16, 2016  (JP) .................. 2016-051766

(51) Int. Cl.
*H02M 1/092* (2006.01)
*H02M 7/537* (2006.01)
(Continued)

(52) U.S. Cl.
CPC ............. *H02M 7/537* (2013.01); *H02M 1/08* (2013.01); *H03K 17/16* (2013.01); *H03K 17/687* (2013.01); *H02M 2001/0009* (2013.01)

(58) Field of Classification Search
CPC ........ H02M 1/08; H02M 1/0892; H02M 7/53; H02M 7/537; H02M 7/5387; H02M 2001/0003
See application file for complete search history.

(56) References Cited

U.S. PATENT DOCUMENTS 4,880,995 A * 11/1989 Mori ................ H03K 17/04126
327/109
4,949,213 A * 8/1990 Sasagawa ........ H03K 17/08128
327/109

(Continued)

FOREIGN PATENT DOCUMENTS

JP    2015-023774    2/2015

OTHER PUBLICATIONS

International Search Report of PCT application No. PCT/JP2017/007654 dated Apr. 18, 2017.

*Primary Examiner* — Gary L Laxton
(74) *Attorney, Agent, or Firm* — McDermott Will & Emery LLP

(57) ABSTRACT

A light-receiving circuit receives light emitted by a light-emitting part and generates an energization signal that is an electric current based on intensity of the light. A hold circuit is configured to supply an electric charge of an energization signal to a high electric potential terminal and not to decrease a voltage of the high electric potential terminal in a case where a control circuit is sending an OFF signal. Furthermore, the hold circuit is configured not to supply the electric charge of the energization signal to the high electric potential terminal and to keep the voltage of the high electric potential terminal in a case where the control circuit is sending an ON signal. A comparison circuit compares a comparison signal and a reference signal, generates a bias voltage based on a result of the comparison between the comparison signal and the reference signal, and feeds back (Continued)

the bias voltage as a reference signal. A driving circuit supplies the bias voltage to a reference terminal while the control circuit is sending the OFF signal.

7 Claims, 5 Drawing Sheets

(51) Int. Cl.
*H02M 1/08* (2006.01)
*H03K 17/687* (2006.01)
*H03K 17/16* (2006.01)
*H02M 7/5387* (2007.01)
*H02M 1/00* (2006.01)

(56) References Cited

U.S. PATENT DOCUMENTS

| | | | | |
|---|---|---|---|---|
| 5,880,950 A | * | 3/1999 | Kim | H02M 7/53875 323/902 |
| 2012/0293218 A1 | * | 11/2012 | Dewa | H03K 17/063 327/109 |
| 2013/0076405 A1 | * | 3/2013 | Ransom | H02M 1/08 327/109 |

* cited by examiner

POWER CONVERSION CIRCUIT

CROSS-REFERENCE TO RELATED APPLICATIONS

This application is a U.S. national stage application of the PCT International Application No. PCT/JP2017/007654 filed on Feb. 28, 2017, which claims the benefit of foreign priority of Japanese patent application No. 2016-051766 filed on Mar. 16, 2016, the contents all of which are incorporated herein by reference.

TECHNICAL FIELD

The present invention relates to a power conversion circuit used for various electronic devices.

BACKGROUND ART

A conventional power conversion circuit will be described below with reference to the accompanying drawing. FIG. 5 is a circuit block diagram illustrating a configuration of power conversion device 2 using conventional power conversion circuit 1. Power conversion circuit 1 includes low-side switch 3, driving circuit 4, detection circuit 5, and switching circuit 6. Power conversion circuit 8 that includes high-side switch 7 is connected in parallel with power conversion circuit 1. FIG. 5 illustrates an example in which power conversion circuit 1 is disposed for use on a low side of power conversion device 2.

In power conversion device 2, high-side switch 7 and low-side switch 3 alternately turn on and off, and thus power conversion circuit 8 and power conversion circuit 1 operate. As a result, output terminal 9 alternately outputs a positive electric potential obtained by power conversion circuit 8 and a negative electric potential obtained by power conversion circuit 1. That is, output terminal 9 outputs an alternating-current voltage.

Driving circuit 4 controls ON and OFF of low-side switch 3 such that high-side switch 7 and low-side switch 3 are not turned on concurrently. This intends to prevent a through-current generated when high-side switch 7 and low-side switch 3 are turned on concurrently. Furthermore, detection circuit 5 detects an output voltage of power conversion circuit 8. In a case where the output voltage of power conversion circuit 8 is equal to or higher than a predetermined threshold value, detection circuit 5 controls switching circuit 6 such that low-side switch 3 is not turned on.

It should be noted that, for example, PTL 1 is known as a prior art document containing information related to the invention in this application.
Citation List
Patent Literature
PTL 1: Unexamined Japanese Patent Publication No. 2015-23774

SUMMARY OF THE INVENTION

In conventional power conversion circuit 1, closed loop L is formed by detection circuit 5, switching circuit 6, and low-side switch 3. Noise that occurs outside closed loop L easily enters closed loop L. For this reason, detection circuit 5, switching circuit 6, or low-side switch 3 has a risk of being affected by noise during operation.

As a result, operation of low-side switch 3 is liable to become unstable. This generates a through-current, thereby leading to shortage of a length of life of low-side switch 3 and high-side switch 7.

An object of the present invention is to provide a power conversion circuit that is less affected by noise and operates stably for a long period.

In order to accomplish the object, a power conversion circuit according to the present invention includes a control circuit, a power switching element, a driving circuit, a light-receiving circuit, a hold circuit, and a comparison circuit. The control circuit that alternately sends an OFF signal and an ON signal. The power switching element has a control terminal, a reference terminal, and a light-emitting part that emits light in accordance with an energization current. The driving circuit is connected to the control terminal and the reference terminal and drives the power switching element. The light-receiving circuit receives the light emitted by the light-emitting part and generates an energization signal that is an electric signal based on intensity of the light. The hold circuit has a comparison signal capacitor including a high electric potential terminal. The hold circuit is configured to supply an electric charge of an energization signal to the high electric potential terminal and not to decrease a voltage of the high electric potential terminal in a case where the control circuit is sending the OFF signal. Furthermore, the hold circuit is configured not to supply an electric charge of an energization signal to the high electric potential terminal and to maintain the voltage of the high electric potential terminal in a case where the control circuit is sending the ON signal. The hold circuit supplies the voltage of the high electric potential terminal as a comparison signal. The comparison circuit compares the comparison signal and a reference signal, generates a bias voltage based on a result of the comparison between the comparison signal and the reference signal, and feeds back the bias voltage as the reference signal. The driving circuit supplies the bias voltage to the reference terminal while the control circuit is sending the OFF signal.

According to the present invention, even in a case where erroneous ignition occurs in a power switching element, a period of continuation of the erroneous ignition becomes extremely short and a frequency of occurrence of the erroneous ignition becomes low, and thus successive occurrence of erroneous ignition is suppressed. This stabilizes operation of the power switching element, and therefore a through-current occurs only sporadically for a short period.

As a result, operation of the power conversion circuit is less affected by external noise. Furthermore, a through-current is less likely to occur in the power conversion circuit. Therefore, a power switching element stably operates for a long period, and a length of life of the power switching element can be prolonged.

DESCRIPTION OF EMBODIMENT

An exemplary embodiment of the present invention will be described below with reference to the accompanying drawings.

Exemplary Embodiment

Figure 1:
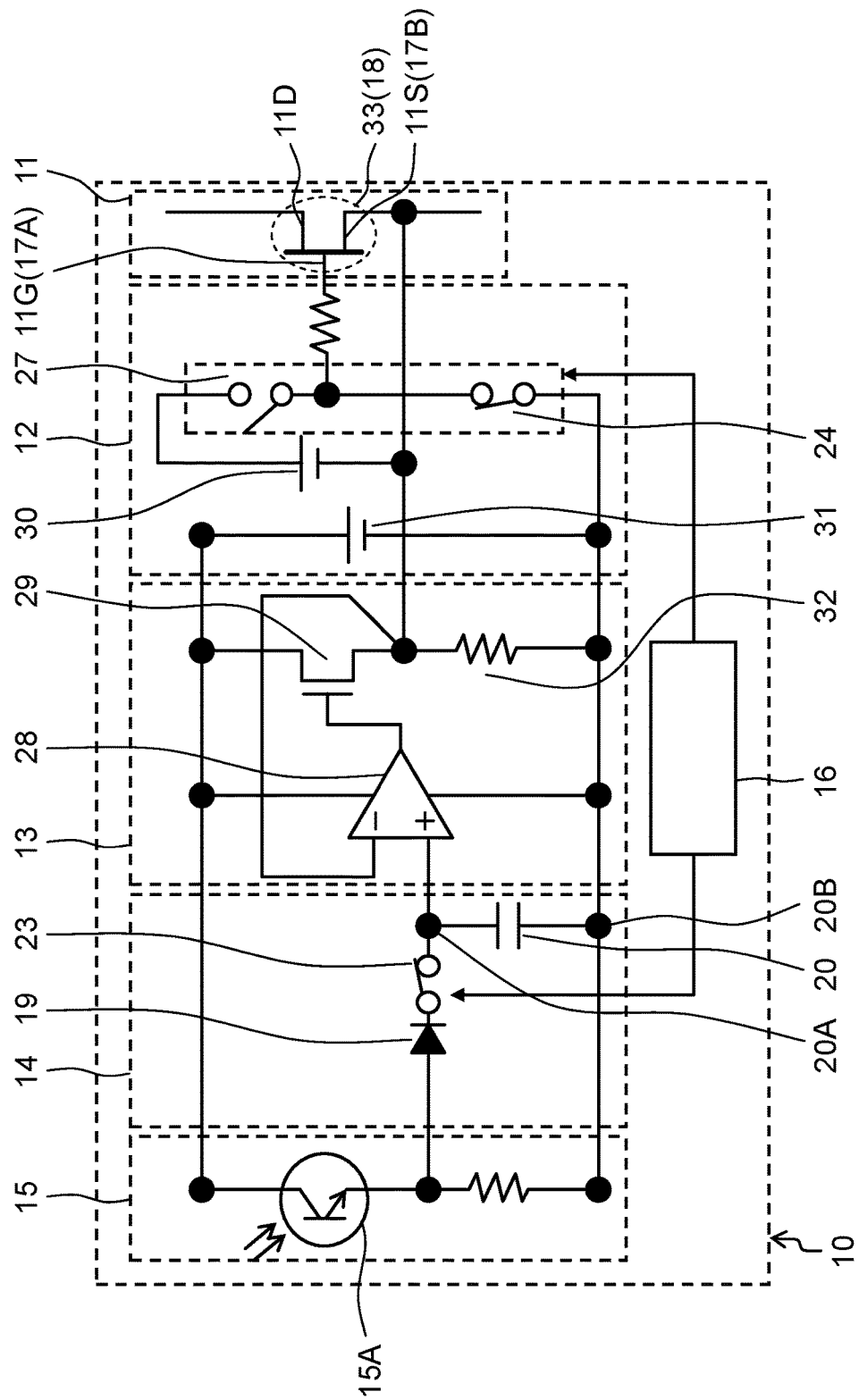
FIG. 1 is a circuit block diagram illustrating a configuration of a power conversion circuit according to an exemplary embodiment of the present invention.

FIG. 1 is a circuit block diagram illustrating a configuration of power conversion circuit 10 according to an exemplary embodiment of the present invention.

Power conversion circuit 10 includes control circuit 16, power switching element 11, driving circuit 12, light-receiving circuit 15, hold circuit 14, and comparison circuit 13.

Control circuit 16 alternately sends an OFF-level control signal (OFF signal) and an ON-level control signal (ON signal).

Power switching element 11 includes control terminal 17A, reference terminal 17B, and light-emitting part 18 that emits light in accordance with an energization current flowing through power switching element 11. In the present exemplary embodiment, power switching element 11 is a field-effect transistor that has control terminal 17A as gate terminal 11G and reference terminal 17B as source terminal 11S. In the present exemplary embodiment, the energization current is a drain current or a gate current in power switching element 11. In the present exemplary embodiment, light-emitting part 18 is PN junction part 33 formed between a drain and a source or a gate and a source of power switching element 11.

Driving circuit 12 is connected to control terminal 17A and reference terminal 17B and sends a drive signal to power switching element 11. That is, driving circuit 12 drives power switching element 11.

Light-receiving circuit 15 receives light emitted by light-emitting part 18 and generates an energization signal that is an electric current based on intensity of the light.

Hold circuit 14 includes comparison signal capacitor 20 including high electric potential terminal 20A. Hold circuit 14 is configured to supply an electric charge of the energization signal to high electric potential terminal 20A and not to decrease a voltage of high electric potential terminal 20A while control circuit 16 is sending the OFF-level control signal. Furthermore, hold circuit 14 is configured not to supply the electric charge of the energization signal to high electric potential terminal 20A and to maintain the voltage of high electric potential terminal 20A while control circuit 16 is sending the ON-level control signal. Hold circuit 14 supplies the voltage of high electric potential terminal 20A as a comparison signal.

Comparison circuit 13 compares the comparison signal and a reference signal, generates a bias voltage based on a result of the comparison between the comparison signal and the reference signal, and feeds back the bias voltage as a reference signal.

Driving circuit 12 supplies the bias voltage to reference terminal 17B while control circuit 16 is sending the OFF-level control signal.

According to the above configuration and operation, power switching element 11 can stably operate for a long period. It is therefore possible to prolong a length of life of power switching element 11.

Specifically, in a case where a through-current occurs due to erroneous ignition that is caused in power switching element 11, for example, by external noise superimposed on a control signal or a drive signal while the control signal sent from control circuit 16 is at an OFF level, the through current is suppressed as described later in detail. In the present exemplary embodiment, in a case where erroneous ignition occurs in power switching element 11, a bias voltage that corresponds to a voltage of an energization signal generated by the erroneous ignition is added to the drive signal during an OFF-level period of the control signal. This allows driving circuit 12 to more accurately drive power switching element 11.

In other words, a through-current that occurs due to unnecessary turn-on (ignition) of power switching element 11 in a case where the control signal is at the OFF level triggers suppression of subsequent occurrence of erroneous ignition and a through-current caused by the erroneous ignition.

As a result, operation of power conversion circuit 10 is less affected by external noise. Furthermore, a successive or intermittent through-current is less likely to occur in power conversion circuit 10. For this reason, power switching element 11 stably operates for a long period, and a length of life of power switching element 11 can be prolonged.

Figure 2:
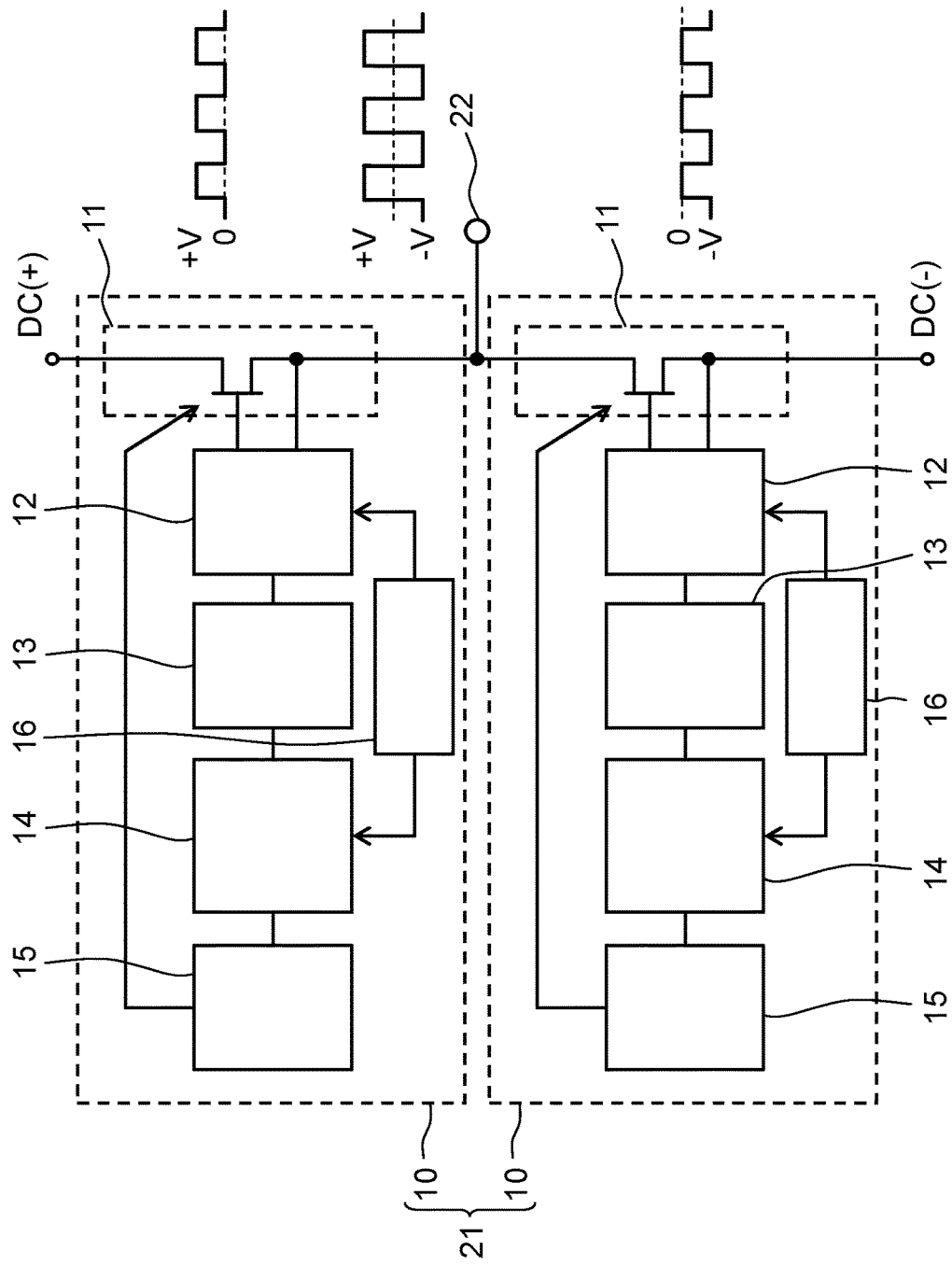
FIG. 2 is a circuit block diagram illustrating a configuration of an inverter device including the power conversion circuits according to the exemplary embodiment of the present invention.
Figure 3:
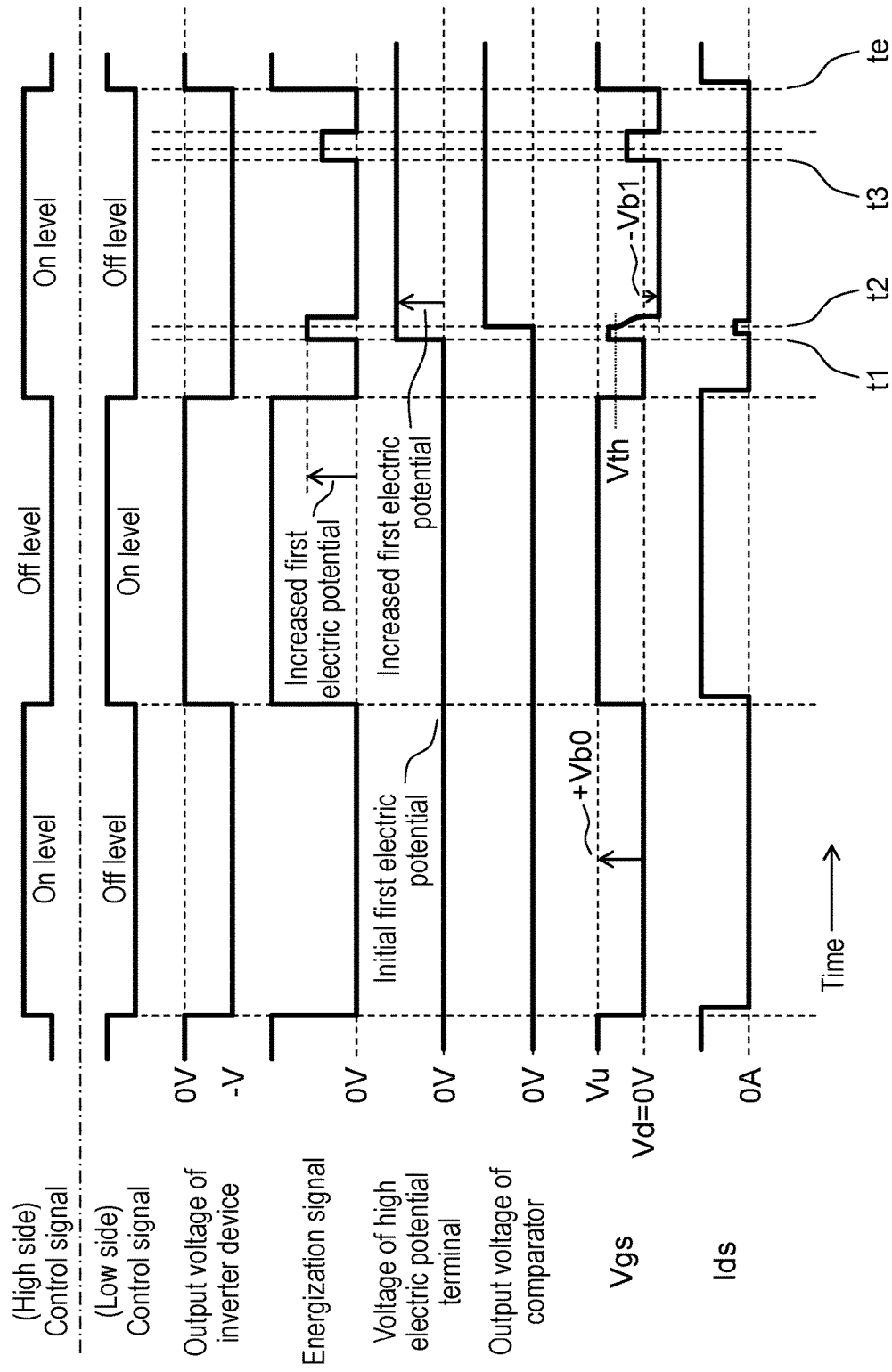
FIG. 3 is a timing diagram illustrating operation of the power conversion circuit according to the exemplary embodiment of the present invention.

Power conversion circuit 10 will now be described in detail below. FIG. 2 is a circuit block diagram illustrating a configuration of inverter device 21 including power conversion circuits 10 according to the exemplary embodiment of the present invention. FIG. 3 is a timing diagram illustrating operation of power conversion circuit 10 according to the exemplary embodiment of the present invention.

Inverter device 21 includes high-side power conversion circuit 10 connected to a direct-current positive electric potential and low-side power conversion circuit 10 connected to a direct-current negative electric potential. High-side power conversion circuit 10 alternately outputs 0 and +V, and low-side power conversion circuit 10 alternately outputs 0 and −V. Inverter device 21 alternately outputs +V output by high-side power conversion circuit 10 and −V output by low-side power conversion circuit 10 from inverter output terminal 22.

As described above, high-side power conversion circuit 10 and low-side power conversion circuit 10 each alternately output 0 and a predetermined electric potential. Accordingly, power switching element 11 of low-side power conversion circuit 10 is in a non-conduction state while power switching element 11 of high-side power conversion circuit 10 is in a conduction state. Each power switching element 11 alternates between the conduction state and the non-conduction state. Therefore, during a normal operation state, inverter device 21 is not controlled such that both of low-side power switching element 11 and high-side power switching element 11 are in the conduction state.

High-side power conversion circuit 10 and low-side power conversion circuit 10 have a substantially identical configuration except for that polarities are different and operate in a similar manner. For this reason, low-side power conversion circuit 10 is used in the following description. FIG. 3 mainly illustrates a timing diagram of low-side power conversion circuit 10.

As described above, high-side power switching element 11 and low-side power switching element 11 each are alternately turned on and off by the drive signal. The drive signal is generated by driving circuit 12 based on the ON-level or OFF-level control signal sent from control circuit 16 for corresponding power switching element 11. Here, the high-side control signal and the low-side control signal are reverse to each other.

First, a state in which power switching element 11 is operating without erroneous ignition without intrusion of noise into power conversion circuit 10 is described.

In a case where the ON-level control signal is sent from control circuit 16 and a drive signal of a voltage equal to or higher than gate-source threshold voltage Vth is sent from driving circuit 12 to control terminal 17A of low-side power switching element 11, power switching element 11 shifts to a conduction state. In other words, a drain current or a gate current flows as an energization current. Especially in a case where a gallium nitride semiconductor (GaN semiconductor) is used for power switching element 11, a gate current flows as the energization current. Light-emitting part 18 emits light accordingly. In a case where light-receiving part 15A of light-receiving circuit 15 detects the light emitted by light-emitting part 18, light-receiving circuit 15 generates an energization signal. Light-receiving circuit 15 sends the energization signal to hold circuit 14. The energization signal follows light emission of light-emitting part 18 as described above. Accordingly, a waveform of the energization signal substantially synchronizes with a waveform of the drive signal.

Intensity of the light emitted by light-emitting part 18 changes substantially in proportion to magnitude of the energization current flowing through power switching element 11. Furthermore, a voltage of the energization signal generated by light-receiving circuit 15 changes substantially in proportion to the intensity of the light emitted by light-emitting part 18.

Hold circuit 14 includes update diode 19 connected to light-receiving circuit 15 and update switch 23 disposed between a cathode of update diode 19 and high electric potential terminal 20A. The energization signal is sent from update diode 19 of hold circuit 14 to high electric potential terminal 20A of comparison signal capacitor 20 through update switch 23 by light-receiving circuit 15. An electronic component such as a resistor may be disposed between the cathode of update diode 19 and update switch 23. Similarly, an electronic component such as a resistor may be disposed between high electric potential terminal 20A and update switch 23.

Update switch 23 synchronizes with OFF-level switch 24 and ON-level switch 27 of driving circuit 12. Update switch 23 is closed in a case where ON-level switch 27 is opened and OFF-level switch 24 is closed. Update switch 23 is opened in a case where ON-level switch 27 is closed and OFF-level switch 24 is opened. Opening/closing of ON-level switch 27 and OFF-level switch 24 is controlled by control circuit 16. That is, hold circuit 14 is configured to close update switch 23 while control circuit 16 is sending the OFF-level control signal. Furthermore, hold circuit 14 is configured to open update switch 23 while control circuit 16 is sending the ON-level control signal.

OFF-level switch 24 is closed in accordance with the OFF-level control signal and is opened in accordance with the ON-level control signal. OFF-level switch 24 is normally closed in a case where update switch 23 is closed. As a result, gate-source voltage Vgs lower than gate-source threshold voltage Vth is supplied to power switching element 11. This shifts power switching element 11 to the non-conduction state, and therefore light-receiving circuit 15 does not send the energization signal. Accordingly, an electric charge is not supplied from light-receiving circuit 15 to comparison signal capacitor 20. That is, an electric potential of high electric potential terminal 20A is maintained.

Comparison signal capacitor 20 has high electric potential terminal 20A and terminal 20B. An electric potential (an electric potential difference between high electric potential terminal 20A and terminal 20B) of high electric potential terminal 20A is set as a first electric potential. However, the electric potential of high electric potential terminal 20A is frequently updated due to occurrence of erroneous ignition in power switching element 11 during operation of power conversion circuit 10, as described later. In view of this, the first electric potential that is the electric potential of high electric potential terminal 20A is desirably set to an electric potential of 0 by creating a state where there is no electric charge in comparison signal capacitor 20 when power conversion circuit 10 is activated.

ON-level switch 27 is closed in accordance with the ON-level control signal and is opened in accordance with the OFF-level control signal. ON-level switch 27 is normally closed in a case where update switch 23 is opened. Accordingly, gate-source voltage Vgs higher than gate-source threshold voltage Vth is supplied from positive power source 30 provided in driving circuit 12 to power switching element 11. This shifts power switching element 11 to the conduction state, and therefore light-receiving circuit 15 sends the energization signal. Since update switch 23 is opened, no electric charge is supplied from light-receiving circuit 15 to comparison signal capacitor 20 even in a case where light-receiving circuit 15 sends the energization signal. That is, the electric potential of high electric potential terminal 20A is maintained.

A period before t1 in the timing diagram of FIG. 3 corresponds to the above state. Before t1, the electric potential of high electric potential terminal 20A is always kept at the initial first electric potential. In other words, power switching element 11 is operating without erroneous ignition.

The electric potential of high electric potential terminal 20A is sent as a comparison signal from hold circuit 14 to comparison circuit 13. Comparison circuit 13 includes comparator 28, comparison switch 29, and bias resistor 32 connected to comparison switch 29. The comparison signal described above is supplied to comparator 28 of comparison circuit 13. An output signal of comparator 28 is used to control comparison switch 29. An output of comparison switch 29 is supplied as a bias voltage to driving circuit 12. The bias voltage is supplied to power switching element 11 as an electric potential difference between both ends of bias resistor 32 especially in a case where the control signal is at the OFF level. The bias voltage is fed back to comparator 28 as a reference signal of comparator 28.

In a case where the electric potential of high electric potential terminal 20A is the initial electric potential level of 0, the electric potential of the comparison signal is not higher than an electric potential of the reference signal of comparator 28. That is, comparator 28 does not send the output signal. This shifts comparison switch 29 into a non-conduction state, and therefore bias resistor 32 is not connected to negative power source 31. That is, an electric potential difference does not occur in bias resistor 32. This state also corresponds to the period before t1 in the timing diagram. Therefore, since the bias voltage is 0V in a case where the control signal is at the OFF level, gate-source voltage Vgs supplied from driving circuit 12 to power switching element 11 is 0V. Furthermore, in a case where the control signal is at the ON level, gate-source voltage Vgs supplied from driving circuit 12 to power switching element 11 is +Vb0 of positive power source 30. In this state, the bias voltage is not used.

During the period before t1 in the timing diagram of FIG. 3, gate-source voltage Vgs is 0V in a case where the control signal is at the OFF level. That is, an electric potential difference between gate terminal 11G that corresponds to control terminal 17A and source terminal 11S that corresponds to reference terminal 17B is 0V. Accordingly, no electric current flows between drain terminal 11D and source terminal 11S in power switching element 11.

In a case where the control signal is at the ON level, gate-source voltage Vgs is +Vb0. That is, the electric potential difference between gate terminal 11G that corresponds to control terminal 17A and source terminal 11S that corresponds to reference terminal 17B is higher than gate-source threshold voltage Vth. Accordingly, an electric current flows between drain terminal 11D and source terminal 11S in power switching element 11.

In other words, high electric potential side value Vu of gate-source voltage Vgs in a case where the control signal is at the ON level is set as +Vb0. Low electric potential side value Vd of gate-source voltage Vgs in a case where the control signal is at the OFF level is set as 0V. Accordingly, low-side power conversion circuit 10 alternately outputs 0 and −V.

As described earlier, the period before t1 described above corresponds to a state where power conversion circuit 10 is free from external noise or the like especially both in a case where the control signal is at the ON level and in a case where the control signal is at the OFF level. Meanwhile, there are cases where erroneous ignition occurs in power switching element 11 due to external noise superimposed on the control signal or the drive signal especially in a case where the control signal is at the OFF level. In such cases, a through-current occurs in power conversion circuit 10. Operation of power conversion circuit 10 in such cases is described below.

Update switch 23 is opened in a case where the control signal is at the ON level. Concurrently, ON-level switch 27 is closed, and the drive signal is supplied from positive power source 30 to power switching element 11. Therefore, power switching element 11 is hardly affected by noise even in a case where external noise or the like intrudes into power conversion circuit 10.

For example, in a case where external noise is superimposed on a drive signal at t1 in the timing diagram, gate-source voltage Vgs rises to a positive electric potential side in an impulse manner. When gate-source voltage Vgs exceeds gate-source threshold voltage Vth, power switching element 11 shifts from the non-conduction state to the conduction state. This causes the energization current to flow in power switching element 11.

Concurrently, light-emitting part 18 of power switching element 11 emits light. Light-receiving circuit 15 generates the energization signal in response to the light emission of light-emitting part 18. This state corresponds to t1 in the timing diagram as described earlier. In this state, update switch 23 of hold circuit 14 is closed since the control signal is at the OFF level. Accordingly, a voltage rise of the energization signal increases the electric potential of high electric potential terminal 20A of comparison signal capacitor 20 that is the first electric potential before t1. The increased first electric potential is kept as an updated first electric potential in comparison signal capacitor 20. Furthermore, the rise of the first electric potential of high electric potential terminal 20A increases the electric potential of the comparison signal. Since the electric potential of the comparison signal becomes higher than the electric potential of the reference signal of comparator 28, a voltage of the output signal of comparator 28 also rises. Comparison switch 29 shifts from the non-conduction state to a conduction state.

This causes bias resistor 32 to be connected to negative power source 31. As a result, negative power source 31 causes an electric potential difference of −Vb1 in bias resistor 32. Source terminal 11S and gate terminal 11G of power switching element 11 are connected via bias resistor 32 and OFF-level switch 24. As described above, comparison circuit 13 compares the comparison signal and the reference signal and generates, as the bias voltage, an output of comparison switch 29 based on a result of the comparison between the comparison signal and the reference signal. Driving circuit 12 supplies the bias voltage to source terminal 11S. Accordingly, the electric potential of gate terminal 11G becomes relatively lower than the electric potential of source terminal 11S. As a result, gate-source voltage Vgs decreases to −Vb1 at t2 in response to the rise of gate-source voltage Vgs to a value higher than gate-source threshold voltage Vth that is caused by noise at t1.

Accordingly, gate-source voltage Vgs shifts toward a negative side until the control signal is switched to the ON level after t2. Gate-source threshold voltage Vth is a fixed value. Gate-source voltage Vgs becomes lower than gate-source threshold voltage Vth after t2 in accordance with the shift of gate-source voltage Vgs toward the negative side. Accordingly, power switching element 11 turns off at t2 immediately after turning on at t1. That is, a period in which drain-source current Ids flows during an OFF-level period of the control signal corresponds to a period from t1 to t2 in which power switching element 11 is in the conduction state.

Furthermore, the energization signal on which noise is superimposed increases the electric potential of high electric potential terminal 20A of comparison signal capacitor 20 during the period from t1 to t2. An increased electric charge of comparison signal capacitor 20 continues to be present. Accordingly, the output voltage of comparator 28 keeps the increased state, and comparison switch 29 keeps the conduction state.

As a result, gate-source voltage Vgs becomes −Vb1. That is, gate-source voltage Vgs is supplied from comparison circuit 13 to driving circuit 12 while keeping a deeper negative bias than a case where gate-source voltage Vgs is 0V. A state where gate-source voltage Vgs keeps −Vb1 continues to te at which the control signal switches from the OFF level to the ON level as described earlier. Gate-source voltage Vgs switches from the negative side to high electric potential side value Vu at this timing.

The through-current is unlikely to occur in power conversion circuit 10 even in a case where gate-source voltage Vgs lower than gate-source voltage Vgs generated at t1 is generated by different noise before the control signal switches from the OFF level to the ON level, for example, at t3. Gate-source voltage Vgs (−Vb1) is generated based on the electric potential of high electric potential terminal 20A generated corresponding to magnitude of noise occurring at t1. Accordingly, gate-source voltage Vgs at t3 does not reach gate-source threshold voltage Vth even in a case where noise equivalent to the noise occurring at t1 or noise lower than the noise occurring at t1 is superimposed on gate-source voltage Vgs. Therefore, power switching element 11 keeps the non-conduction state.

Alternatively, in a case where gate-source voltage Vgs higher than gate-source voltage Vgs generated at t1 is generated before te, gate-source voltage Vgs shifts to a more negative side by deeper negative bias than −Vb1 (not illustrated). A state where gate-source voltage Vgs shifts to the more negative side continues till te at which the control signal switches from the OFF level to the ON level.

Hold circuit 14 includes update diode 19 and update switch 23. This allows hold circuit 14 to continuously keep the electric charge of comparison signal capacitor 20 accumulated in accordance with the magnitude of the noise described earlier. That is, hold circuit 14 is configured not to decrease the voltage of high electric potential terminal 20A while control circuit 16 is sending the OFF-level control signal. Furthermore, hold circuit 14 is configured to maintain the voltage of high electric potential terminal 20A while control circuit 16 is sending the ON-level control signal. Accordingly, gate-source voltage Vgs is set as −Vb1 from the start in a case where the ON-level state of the control signal starting at te switches to the OFF-level state again (not illustrated).

As described above, in a case where erroneous ignition occurs in power switching element 11 due to external noise, light-emitting part 18 emits light that is less affected by electromagnetic noise. Furthermore, a bias voltage corresponding to intensity of light generated by erroneous ignition is generated. The bias voltage is supplied to source terminal 11S during the OFF-level period of the control signal. That is, driving circuit 12 increases the electric potential of source terminal 11S to a value higher than the electric potential of gate terminal 11G in accordance with the bias voltage while control circuit 16 is sending the OFF-level control signal. As a result, power conversion circuit 10 is less adversely affected by noise, and control circuit 16 can control power switching element 11 more accurately. In other words, even in a case where noise that continues longer than the period from t1 to t2 occurs, an effect of the noise is restricted to the period from t1 to t2. The period from t1 to t2 is a period for operation of comparison circuit 13 including comparator 28 and comparison switch 29 and is very short.

As a result, operation of power conversion circuit 10 is less affected by external noise. In a case where erroneous ignition occurs in power switching element 11, a bias voltage that suppresses the erroneous ignition is added to driving circuit 12 after a period necessary for comparison operation. Accordingly, a continuous through-current is less likely to occur in power conversion circuit 10.

Furthermore, a depth of the bias voltage is sequentially updated in accordance with magnitude of noise received by power conversion circuit 10 during a period in which the control signal is at the OFF level. Accordingly, in a case where noise occurs plural times within the OFF-level period and later noise becomes larger than initial noise, a bias voltage added to driving circuit 12 by the later noise becomes deeper by operation of comparison circuit 13. An effect of the later noise is suppressed in advance by a bias voltage generated by the initial noise. Accordingly, even in a case where noise occurs successively or sporadically plural times, occurrence of the through-current is kept small in a short period or kept sporadic.

As a result, power switching element 11 stably operates for a long period, and a length of life of power switching element 11 can be prolonged.

Figure 4:
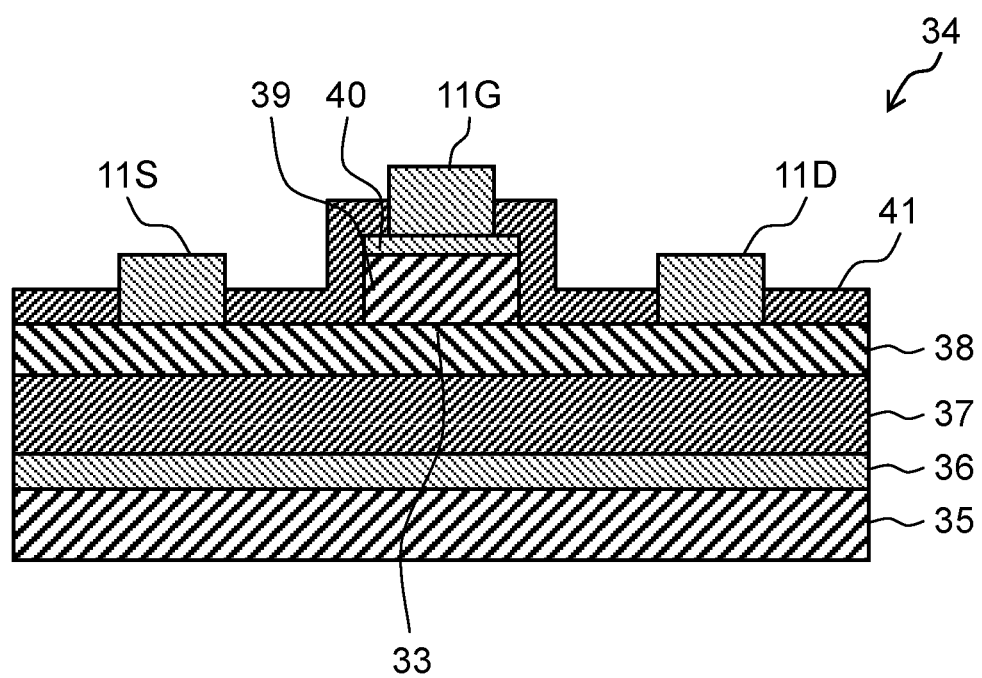
FIG. 4 is an outline cross-sectional view of a power switching element according to the exemplary embodiment of the present invention.
Figure 5:
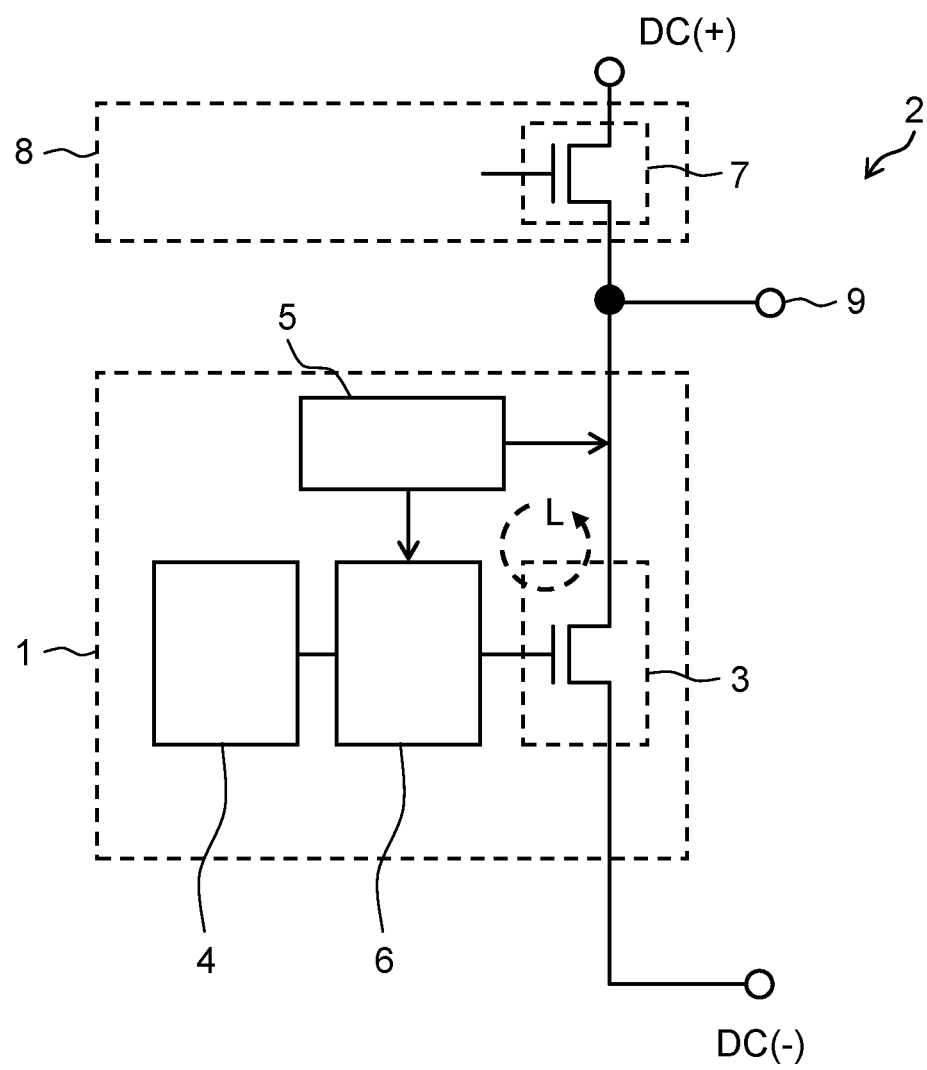
FIG. 5 is a circuit block diagram illustrating a configuration of a conventional power conversion circuit.

FIG. 4 is an outline cross-sectional view of power switching element 11 in power conversion circuit 10 according to the exemplary embodiment of the present invention. Power switching element 11 can be any semiconductor element in which intensity of light emission of light-emitting part 18 changes in accordance with magnitude of an energization current. The following describes a case where a normally-off GaN transistor 34 is used as power switching element 11.

That is, in this case, power switching element 11 is a field effect transistor containing gallium nitride. GaN transistor 34 includes sapphire substrate 35, buffer layer 36, undoped GaN layer 37, n-type undoped AlGaN layer 38, p-type control layer 39, p-type contact layer 40, insulating layer 41, gate terminal 11G, drain terminal 11D, and source terminal 11S. Buffer layer 36 is provided on a surface of sapphire substrate 35. Undoped GaN layer 37 is provided on a side of buffer layer 36 opposite to sapphire substrate 35. Undoped AlGaN layer 38 is provided on a side of undoped GaN layer 37 opposite to buffer layer 36. Gate terminal 11G, drain terminal 11D, and source terminal 11S are provided on a side of undoped AlGaN layer 38 opposite to undoped GaN layer 37. Furthermore, p-type control layer 39 and p-type contact layer 40 for achieving a normally-off function are provided between undoped AlGaN layer 38 and gate terminal 11G in this order from undoped AlGaN layer 38. Furthermore, a surface of undoped AlGaN layer 38 is covered with insulating layer 41 except for portions where gate terminal 11G, drain terminal 11D, and source 11S are disposed.

In a case where a positive electric potential is applied to gate terminal 11G such that an electric potential of gate terminal 11G becomes higher than an electric potential of source terminal 11S by a predetermined electric potential difference or more, PN junction part 33 formed at a junction of p-type control layer 39 and undoped AlGaN layer 38 is biased in a forward direction. Accordingly, a gate current flows from gate terminal 11G to source terminal 11S. This causes recoupling of electrons at PN junction part 33, and light of intensity corresponding to the flowing gate current is emitted. In other words, light-emitting part 18 of power switching element 11 using a GaN semiconductor emits light of intensity corresponding to an energization current flowing from gate terminal 11G to source terminal 11S. Therefore, the energization current flowing in PN junction part 33 has correlation with the electric potential of gate terminal 11G.

As a result, erroneous ignition caused by a rise in electric potential of gate terminal 11G during a turn-off period can be detected at an early stage by detecting intensity of light emission of light-emitting part 18.

As described above, in a case where erroneous ignition occurs in power switching element 11 due to external noise, light-emitting part 18 emits light that is less affected by electromagnetic noise. Furthermore, a bias voltage corresponding to intensity of light generated by erroneous ignition is generated. The bias voltage is supplied to source terminal 11S during the OFF-level period of the control signal. As a result, power conversion circuit 10 is less adversely affected by noise, and control circuit 16 can control power switching element 11 more accurately.

INDUSTRIAL APPLICABILITY

A power conversion circuit according to the present invention is less affected by external noise and suppresses a through-current. Therefore, a power switching element stably operates for a long period, and a length of life of the power switching element can be prolonged. That is, the power conversion circuit according to the present invention is useful for various kinds of electronic devices.

REFERENCE MARKS IN THE DRAWINGS 10 power conversion circuit
11 power switching element
11G gate terminal
11D drain terminal 11S source terminal
12 driving circuit
13 comparison circuit
14 hold circuit
15 light-receiving circuit
15A light-receiving part
16 control circuit
17A control terminal
17B reference terminal
18 light-emitting part
19 update diode
20 comparison signal capacitor
20A high electric potential terminal
20B terminal
21 inverter device
22 inverter output terminal
23 update switch
24 off-level switch
27 on-level switch
28 comparator
29 comparison switch
30 positive power source
31 negative power source
32 bias resistor
33 PN junction part
34 GaN transistor
35 sapphire substrate
36 buffer layer
37 undoped GaN layer
38 undoped AlGaN layer
39 p-type control layer
40 p-type contact layer
41 insulating layer

The invention claimed is:

1. A power conversion circuit comprising:
   a control circuit that alternately sends an OFF signal and an ON signal;
   a power switching element that has a control terminal, a reference terminal, and a light-emitting part that emits light in accordance with an energization current;
   a driving circuit that is connected to the control terminal and the reference terminal and drives the power switching element;
   a light-receiving circuit that receives the light emitted by the light-emitting part and generates an energization signal that is an electric signal based on intensity of the light;
   a hold circuit that has a comparison signal capacitor including a high electric potential terminal, is configured to supply an electric charge of the energization signal to the high electric potential terminal and not to decrease a voltage of the high electric potential terminal while the control circuit is sending the OFF signal, is configured not to supply the electric charge of the energization signal to the high electric potential terminal and to keep the voltage of the high electric potential terminal while the control circuit is sending the ON signal, and supplies the voltage of the high electric potential terminal as a comparison signal; and
   a comparison circuit that compares the comparison signal and a reference signal, generates a bias voltage based on a result of the comparison between the comparison signal and the reference signal, and feeds back the bias voltage as the reference signal,
   wherein the driving circuit supplies the bias voltage to the reference terminal while the control circuit is sending the OFF signal.

2. The power conversion circuit according to claim 1, wherein
   the driving circuit increases the electric potential of the reference terminal to an electric potential higher than the electric potential of the control terminal in accordance with the bias voltage while the control circuit is sending the OFF signal.

3. The power conversion circuit according to claim 1, wherein
   the hold circuit has an update diode that is connected to the light-receiving circuit and an update switch that is disposed between a cathode of the update diode and the high electric potential terminal, is configured to close the update switch while the control circuit is sending the OFF signal, and is configured to open the update switch while the control circuit is sending the ON signal.

4. The power conversion circuit according to claim 1, wherein
   the power switching element is a field effect transistor that has the control terminal as a gate terminal and the reference terminal as a source terminal.

5. The power conversion circuit according to claim 4, wherein
   the energization signal is a drain current or a gate current in the power switching element.

6. The power conversion circuit according to claim 4, wherein
   the light-emitting part is a PN junction part formed between a drain and a source or between a gate and the source of the power switching element.

7. The power conversion circuit according to claim 4, wherein
   the power switching element is a field effect transistor containing gallium nitride.

* * * * *